(12) United States Patent
Dong et al.

(10) Patent No.: US 11,211,913 B2
(45) Date of Patent: Dec. 28, 2021

(54) GENERATION AND ENHANCEMENT OF SURFACE ACOUSTIC WAVES ON A HIGHLY DOPED P-TYPE III-V SEMICONDUCTOR SUBSTRATE

(71) Applicant: The George Washington University, Washington, DC (US)

(72) Inventors: Boqun Dong, Arlington, VA (US); Mona Zaghloul, Washington, DC (US)

(73) Assignee: The George Washington University, Washington, DC (US)

( * ) Notice: Subject to any disclaimer, the term of this patent is extended or adjusted under 35 U.S.C. 154(b) by 0 days.

(21) Appl. No.: 16/929,234

(22) Filed: Jul. 15, 2020

(65) Prior Publication Data

US 2021/0021254 A1   Jan. 21, 2021

Related U.S. Application Data

(60) Provisional application No. 62/876,331, filed on Jul. 19, 2019.

(51) Int. Cl.
| | |
|---|---|
| *H01L 41/18* | (2006.01) |
| *H03H 9/02* | (2006.01) |
| *H01L 29/20* | (2006.01) |
| *H03H 9/64* | (2006.01) |

(52) U.S. Cl.
CPC ......... *H03H 9/02566* (2013.01); *H01L 29/20* (2013.01); *H01L 41/18* (2013.01); *H03H 9/6426* (2013.01)

(58) Field of Classification Search
None
See application file for complete search history.

(56) References Cited

U.S. PATENT DOCUMENTS

| | | | | |
|---|---|---|---|---|
| 2009/0295505 A1* | 12/2009 | Mohammadi | ......... | H01L 41/107 333/191 |
| 2013/0169383 A1* | 7/2013 | Adkisson | ............. | H03H 9/6423 333/186 |
| 2015/0357987 A1* | 12/2015 | Shealy | ............... | H03H 9/02015 333/187 |

OTHER PUBLICATIONS

B. Dong, et al., "Surface Acoustic Wave Enhancement of Photocathodes", 9th International Particle Accelerator Conference, IPAC2018, pp. 4304-4306.

(Continued)

*Primary Examiner* — Benjamin P Sandvik
(74) *Attorney, Agent, or Firm* — Blank Rome LLP

(57) ABSTRACT

A device employing the generation and enhancement of surface acoustic waves on a highly doped p-type III-V semiconductor substrate (e.g., GaAs, GaSb, InAs, or InGaAs). The device includes two $SiO_2$/ZnO islands, each including a $SiO_2$ buffer layer deposited on the doped p-type III-V semiconductor substrate and a ZnO layer deposited on the $SiO_2$ buffer layer. An input interdigital transducers (IDT) and an output IDT are each patterned on one of the $SiO_2$/ZnO islands. The IDTs generates surface acoustic waves along an exposed surface of the highly doped p-type III-V semiconductor substrate. The surface acoustic waves improve the photoelectric and photovoltaic properties of the device. The device is manufactured using a disclosed technique for propagating strong surface acoustic waves on weak piezoelectric materials. Also disclosed is a photodetector developed using that technique.

21 Claims, 5 Drawing Sheets

(56) References Cited

OTHER PUBLICATIONS

Violante, A., Cohen, K., Lazić, S., Hey, R., Rapaport, R., & Santos, P. V. (2014). Dynamics of indirect exciton transport by moving acoustic fields. New Journal of Physics, 16(3), 033035; 19 pages.

Dong, B., Guo, S., & Zaghloul, M. (Aug. 2016). Simulations of energy-bands bending effect and carriers transportation in semiconductor with propagating Surface Acoustic Waves. In 2016 URSI Asia-Pacific Radio Science Conference (URSI AP-RASC) (pp. 1921-1924). IEEE; 4 pages.

Yuan, M., Hubert, C., Rauwerdink, S., Tahraoui, A., van Someren, B., Biermann, K., & Santos, P. V. (2017). Generation of surface acoustic waves on doped semiconductor substrates. Journal of Physics D: Applied Physics, 50(48), 484004; 7 pages.

Kim, Y., Hunt, W. D., Hickernell, F. S., Higgins, R. J., & Jen, C. K. (1995). ZnO films on {001}-cut< 110>-propagating GaAs substrates for surface acoustic wave device applications. IEEE transactions on ultrasonics, ferroelectrics, and frequency control, 42(3), 351-361; 11 pages.

Kim, S. G., Kim, S. H., Park, J., Kim, G. S., Park, J. H., Saraswat, K. C., . . . & Yu, H. Y. (2019). Infrared Detectable MoS2 Phototransistor and Its Application to Artificial Multilevel Optic-Neural Synapse. ACS nano, 13(9), 10294-10300; 5 pages.

Dong, B., Afanasev, A., Johnson, R., & Zaghloul, M. (2020). Enhancement of Photoemission on p-Type GaAs Using Surface Acoustic Waves. Sensors, 20(8), 2419. DOI: 10.3390/s20082419. 10 pages.

\* cited by examiner

GENERATION AND ENHANCEMENT OF SURFACE ACOUSTIC WAVES ON A HIGHLY DOPED P-TYPE III-V SEMICONDUCTOR SUBSTRATE

CROSS-REFERENCE TO RELATED APPLICATIONS

This application claims priority to U.S. Prov. Pat. Appl. No. 62/876,331, filed Jul. 19, 2019, which is hereby incorporated by reference.

FEDERAL FUNDING

This invention was made with government support under DE-SC0017831 awarded by the U.S. Department of Energy (DOE). The government has certain rights in the invention.

BACKGROUND

III-V semiconductors like gallium arsenide (GaAs) have been widely used in the optoelectronic devices, such as photodetectors, solar cells and photocathodes due to their outstanding photoelectric and photovoltaic properties. Recent research has shown that the optoelectronic performance of GaAs will be significantly improved by using surface acoustic waves (SAWs) generated and propagated on the GaAs surface with the help of interdigital transducers (IDTs) and the applied radio frequency (RF) alternating current (AC) voltage. This applied periodical potential will deform the crystal lattice of GaAs and bend the energy levels up and down, forcefully suppressing the recombination probability of electrons and holes by spatially separating them. As a result, SAWs helps improve the conversion efficiency of photon energy and the quantum efficiency (QE) in many GaAs applications. Applying SAWs can help realize the high-frequency (GHz) operation of the carriers in nanowires of optoelectronic devices. With the help of SAWs, the transportation of a single electron can be faster and more reliable between two distant quantum dots. Although researchers have successfully utilized SAWs in intrinsic GaAs devices to build hybrid structures, prior art methods have yet to generate SAWs on doped GaAs applications.

Doping of GaAs is commonly used in the applications in the optoelectronic field and is an essential method in achieving better photoelectric performance. Therefore, improving the compatibility between doped GaAs and SAWs has been an important research topic in order to widely extend the application range of SAWs in optical and electronic devices. To achieve the generation and propagation of SAWs on a doped GaAs surface, two key factors need to be considered and resolved. First, the piezoelectric coupling coefficient of GaAs is much smaller than those of commonly used piezoelectric materials such as zinc oxide (ZnO), lithium niobite ($LiNbO_3$) and aluminum nitrate (AlN). Therefore, only weak SAW can be generated. Second, when the piezoelectric substrate (in this case, GaAs) has been doped, the concentration of free carriers increases, leading to an electrical screening of the radio frequency field applied on the IDTs, and results in a restraint of the generation of the SAWs. To resolve this electrical screening issue, the doped layer may be placed away from the surface layers where the SAWs are generated and propagated. A metal layer may be added on top of undoped GaAs/AlGaAs (aluminum gallium arsenide) heterostructures on n-type doped GaAs substrate. (The undoped GaAs/AlGaAs layers cover the whole n-doped GaAs, but the metal layer do not.) The metal layer electrically screens the piezoelectric field of SAWs so that the SAWs can travel and reach the GaAs in a mechanical way.

However, to date, prior art methods have yet to be developed to propagate the SAW along the uncovered surface of highly doped p-type GaAs substrate.

SUMMARY

In view of the above drawbacks in the prior art, a method of making a device by generating surface acoustic waves (SAWs) on a highly doped p-type gallium arsenide (GaAs) substrate is disclosed. Also disclosed is the device made by generating the SAWs on the highly doped p-type GaAs substrate.

Zinc oxide and silicon dioxide ($ZnO/SiO_2$) islands are built between metal interdigital transducers (IDTs) and p-type doped GaAs substrate. The thin layer of ZnO may be deposited via using an RF magnetron sputtering system. The recipe of radio frequency (RF) sputtering may be optimized to make sure the deposited ZnO layer has high-quality c-axis oriented crystalline structure, which is crucial to successfully generating the SAW. With the existence of ZnO, the strong piezoelectric coupling effect of ZnO is used to more efficiently convert the electrical energy into mechanical energy and pass to GaAs, thereby increasing the intensity of the SAWs on the GaAs. The $SiO_2$ buffer layer may be over 800 nm thick, which we found to improve the performance of SAWs on p-type GaAs. The 800 nm thick buffer $SiO_2$ layer improves performance of SAWs on the p-type GaAs because the $SiO_2$ buffer layer works as a buffer layer that helps mask the crystalline surface of GaAs and improve the adherence, thus forming a better crystal orientation of ZnO layer. In addition to the enhancement of piezoelectricity, the $ZnO/SiO_2$ islands between metal IDTs and p-type GaAs substrate also help separate the applied radio frequency field from the free carriers doped in GaAs substrate. After applying radio frequency alternating current (AC) voltage, the ZnO layer utilizes its strong piezoelectricity to convert the applied electrical energy to mechanical energy in the form of periodical lattice vibration, generating SAWs. The SAWs then penetrate the $ZnO/SiO_2$ island and reach the surface of GaAs substrate, mechanically passing the energy and the periodical vibration to the crystal lattice of GaAs. As a result, the screening of the applied radio frequency electrical field caused by the free carriers in doped GaAs can be effectively reduced because of the separation. Finally, the thickness of the ZnO layer and the width of IDT fingers may be selected to optimize the performance of SAWs propagating along the p-type GaAs surface.

BRIEF DESCRIPTION OF THE DRAWINGS

The accompanying drawings are incorporated in and constitute a part of this specification. It is to be understood that the drawings illustrate only some examples of the disclosure and other examples or combinations of various examples that are not specifically illustrated in the figures may still fall within the scope of this disclosure. Examples will now be described with additional detail through the use of the drawings, in which.

DETAILED DESCRIPTION

Figure 1:
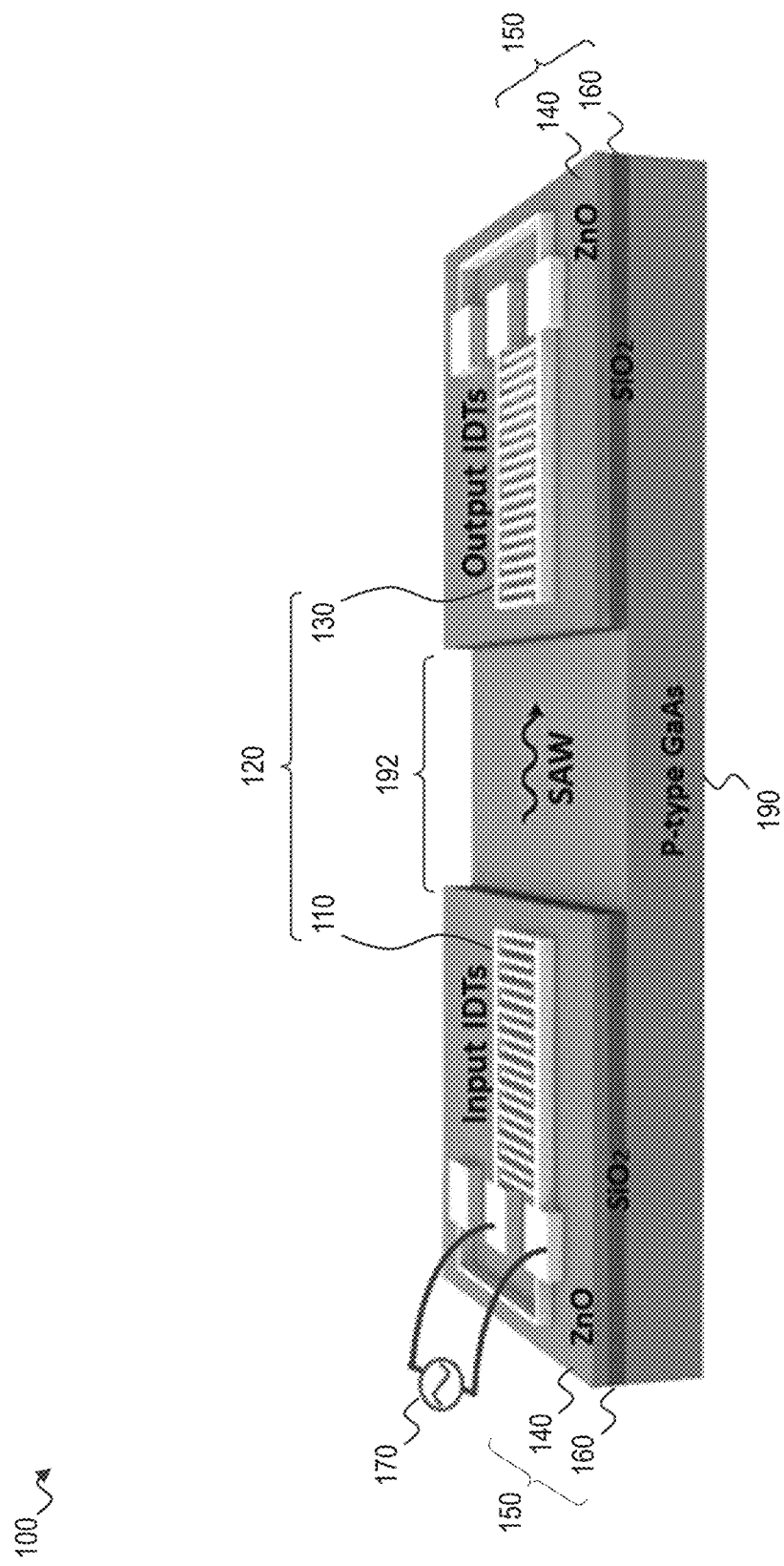
FIG. 1 is a diagram of a device according to an exemplary embodiment.

In describing the illustrative, non-limiting embodiments illustrated in the drawings, specific terminology will be resorted to for the sake of clarity. However, the disclosure is not intended to be limited to the specific terms so selected, and it is to be understood that each specific term includes all technical equivalents that operate in similar manner to accomplish a similar purpose. Several embodiments are described for illustrative purposes, it being understood that the description and claims are not limited to the illustrated embodiments and other embodiments not specifically shown in the drawings may also be within the scope of this disclosure.

FIG. 1 is a diagram of a device 100 according to an exemplary embodiment.

As shown in FIG. 1, the device 100 includes metal interdigital transducers (IDTs) 120, including an input IDT 110 and an output IDT 130. The input IDT 110 is driven by an alternating current source 170. Each of the IDTs 120 are deposited on a zinc oxide (ZnO) layer 140 and a silicon oxide ($SiO_2$) buffer layer 160. Together, the ZnO layer 140 and the $SiO_2$ buffer layer 160 form ZnO/$SiO_2$ islands 150. The IDTs 120 and the ZnO/$SiO_2$ islands 150 are deposited on a highly doped p-type GaAs substrate 190, which includes an exposed surface 192 between the ZnO/$SiO_2$ islands 150.

According to the literature, SAWs propagating along the [011] direction on (100) GaAs are piezoelectric, while along directions like [001] or [010] are not piezoelectric. Therefore, if the p-type GaAs substrate 190 is a p-type (100) GaAs substrate 190, the metal IDTs 120 in the SAW delay line may be oriented along the [011] direction on the p-type (100) GaAs substrate 190. Alternatively, if the GaAs substrate 190 is a (001) GaAs substrate 190, the metal IDTs 120 in the SAW delay line may be oriented along the [110] direction on the (001) GaAs substrate 190. The SAW is generated through the input IDT 110, which are carried on the ZnO/$SiO_2$ island 150 with the RF signals applied by the source 170. The SAW then propagates along the delay line (varied from 500 μm to 2 mm) on the exposed surface 192 of the p-type GaAs substrate 190. The output IDT 130 is used to receive the incoming SAW and to calculate the power transmission ratio.

The metal IDTs 120 may be conventional, single-finger IDTs. The spacing between each IDT finger may be the same as the finger width. In this case, according to the concept and theory of SAW, the wavelength of SAW is equal to four times of the width of an IDT finger when the SAW is launched with the fundamental frequency of the IDT. As the propagating speed of the SAW in each specific material is known, the center frequency of the SAW can be determined. According to literature, the SAW velocity in ZnO varies from 2600 m/s to 5000 m/s depending on the thickness and structure, and the SAW velocity in GaAs is approximately 2700 m/s to 2900 m/s. Because the SAW completely propagates on the exposed surface 192 of the p-type GaAs substrate 190 along the delay line, the center frequency may be determined by the finger widths of the IDTs 130 and the SAW velocity in the GaAs substrate 190.

Figure 2:
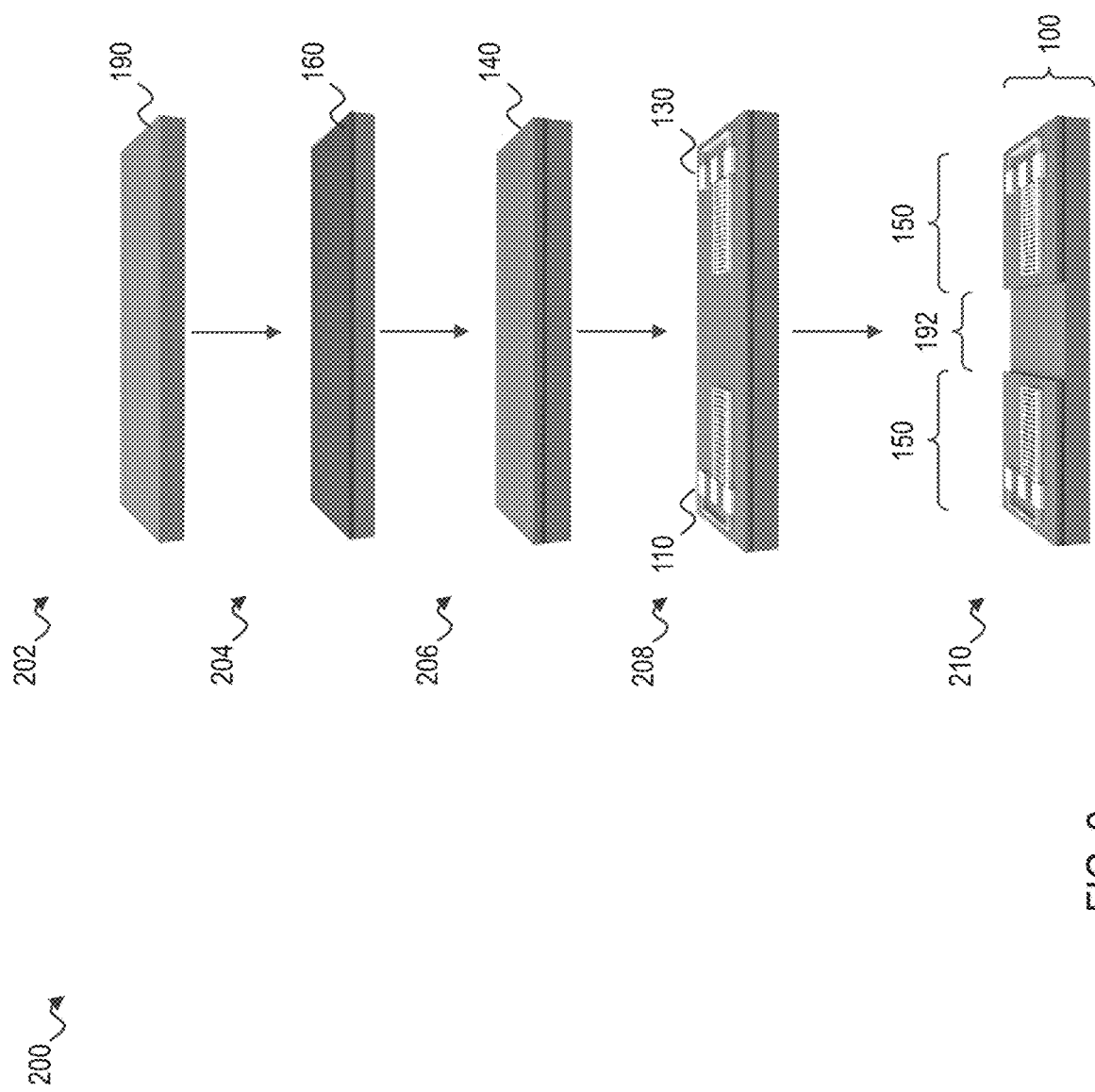
FIG. 2 is a three-dimensional schematic diagram of a process for fabricating the ZnO-enhanced SAW structure according to an exemplary embodiment.

FIG. 2 is a three-dimensional schematic diagram of a process 200 for fabricating the ZnO-enhanced SAW structure 100 according to an exemplary embodiment.

In step 202, process 200 starts with the highly doped p-type (100) GaAs wafer 190 as substrate. The doping concentration of the substrate may range from $5 \times 10^{18}$ $cm^{-3}$ to $3 \times 10^{19}$ $cm^{-3}$. The GaAs wafer 190 may be cleaned, for example by applying acetone and isopropyl alcohol (IPA) as well as using a sonicator if necessary. The wafer 190 has a wafer top surface and a wafer bottom surface.

A $SiO_2$ buffer layer 160 is deposited on the wafer top surface in step 204. For example, a plasma-enhanced chemical vapor deposition (PECVD) method may be used, with an optimized recipe to deposit on top of GaAs substrate at a rate of 120 nanometers/minute. The buffer layer 160 has a buffer top surface and a buffer bottom surface, and in the embodiment shown the buffer bottom surface contacts the wafer top surface.

A thin ZnO layer 140 is deposited on top of the $SiO_2$ buffer layer 160 in step 206. For example, a radio frequency (RF) magnetron sputtering system may be used to deposit the thin ZnO layer 140. The ZnO layer 140 has a ZnO top surface and a ZnO bottom surface, and in the embodiment shown the ZnO bottom surface contacts the buffer top surface. Accordingly, the buffer layer 140 is sandwiched between the wafer 190 and the ZnO layer 140.

Metal IDTs 120 are patterned on the ZnO top surface of the ZnO layer 140 in step 208. As described above, the input IDT 110 may be patterned to generate SAWs propagating along the [011] direction of the GaAs wafer 190. To transfer the pattern, a polymethyl methacrylate (PMMA) A4 photoresist may be spin coated on top of the ZnO layer 140 (for example, with a speed of 3000 rpm for two minutes). The device 100 may be baked, for example on hotplate with temperature of 180° C. for 2 minutes. The spin-coating and heating process may be repeated (e.g., once more). A process of e-beam exposure (for example, with a Raith Voyager Electron Beam Lithography (EBL) system) may be used to transfer the pattern onto the surface. The patterned photoresist may be developed, for example in a methyl isobutyl ketone (MIBK) solution for 90 seconds. Aluminum IDT 120 electrode fingers are formed, for example using metallization with an e-beam evaporator. The unwanted photoresist structure may then be lifted off, for example with acetone for 20 minutes, to get the IDT 120 electrode fingers on the ZnO top surface of the ZnO layer 140.

The center portion of the $SiO_2$ buffer layer 160 and the ZnO layer 140 are etched to expose a portion of the p-type GaAs substrate 190 and form the exposed surface 192 (which is a portion of the wafer top surface) between the two ZnO/SiO$_2$ islands 150 in step 210. For example, another layer of photoresist may be spin coated on top of the ZnO layer 140 using the same method described above. The e-beam exposure process may then be conducted again, for example with the Raith Voyager EBL system, to transfer the second pattern on top center of the device 100. The second pattern may be used to etch the SiO$_2$ buffer layer 160 and the ZnO layer 140 and expose the exposed surface 192 of the p-type GaAs substrate 190 as shown in FIG. 2. The photoresist may be developed in MIBK solution for 90 seconds. A wet etching method and a reactive ion etcher (RIE) method may be used to eliminate the patterned area of the ZnO layer 140 and SiO$_2$ buffer layer 160, respectively, to expose a portion 192 of the p-type GaAs substrate 190 on surface of the device 100. The unwanted photoresist may be lifted off, for example with acetone for 15 minutes, to obtain the final structure of the device 100.

As mentioned above, the ZnO layer 140 has a strong piezoelectric coupling effect that efficiently converts the electrical energy into mechanical energy and increases the intensity of the SAWs on the GaAs substrate 190. For a stronger piezoelectric effect, the ZnO layer 140 should preferably be deposited with a high quality c-plane facing up, as SAW cannot be generated and transmitted strongly on a low quality ZnO surface. The recipe of RF magnetron sputtering system includes many parameters—such as plate temperature, gas flow ratio, VAT pressure, time length, pre-sputter and sputter power—that each have its impact on the deposition results. Through experiments, it has been determined that a high quality ZnO layer 140 may be deposited using a RF magnetron sputtering method with a sputtering condition that includes power (P) of 400 Watts (W), a temperature (T) of 250° C., argon and oxygen (Ar/O$_2$) of 50 standard cubic centimeters per minute (sccm) and 11 sccm, pressure of 8 millitorr (mtorr), and a time of 2 hours. That optimized sputtering condition may be used to grow a high-quality c-axis oriented ZnO film 140 (with a thickness of 1100 nanometers) on the p-type GaAs substrate 190.

By contrast, a ZnO film (with a thickness of 1400 nm) grown using a nonoptimized condition (P=350 W, T=130° C., Ar/O$_2$=69 sccm/0 sccm, pressure=17 mtorr, t=2 hour) is a lower quality ZnO deposition with very rough and cracked surface that cannot be used to generate SAWs because of the difficulty to pattern and deposit metal IDTs 120. The optimized recipe, however, produces a high quality deposited ZnO layer 140 with a smooth and clean surface and small ZnO grain size. The high quality ZnO film 140 grown using the optimized recipe has much higher intensity of (002) peak, less amount of off-oriented crystals, a reduced built-in lattice strain, and reduced full width at half maximum (FWHM) value of the (002) x-ray diffraction (XRD) reflection line. Therefore, with the optimized recipe, a highly textured and highly c-axis oriented ZnO layer 140 may be grown on the p-type GaAs substrate 190.

Growing the high-quality ZnO layer 140 described above on the SiO$_2$ buffer layer 160 described above also improves the crystal orientation of the high-quality ZnO layer 140 along the c-axis direction. Deposited ZnO film 140 on a sample with the added SiO$_2$ buffer layer 160 using the same optimized RF sputtering recipe produces a more visible hexagonal crystal structure with increased grain size, a higher intensity of (002) peak, a reduced built-in lattice strain, and a reduced FWHM value of the (002) XRD reflection line. Therefore, a high-quality ZnO layer 140 can be formed with a SiO$_2$ buffer layer 160 added between the ZnO film 140 and the p-type GaAs substrate 190.

The layers 140, 160, and 190 of the device 100 may have any shape, though in the embodiment shown in step 210 the top and bottom surfaces of each of the layers 140, 160, 190 can be substantially flat (i.e., thin and planar) and formed as a square or rectangle. As further illustrated at step 206, the ZnO layer 140 may have the same area as the SiO$_2$ buffer layer 160 so that the ZnO layer 140 fully covers the SiO$_2$ buffer layer 160. However, in other embodiments, the ZnO layer 140 can have larger or smaller area than the SiO$_2$ buffer layer 160. Because the GaAs substrate 190 is larger than the ZnO/SiO$_2$ islands 150, the ZnO/SiO$_2$ islands 150 only partially cover the GaAs substrate 190 and leave an exposed surface 192 of the GaAs substrate 190 between the ZnO/SiO$_2$, islands 150. The width of the exposed surface 192 between the ZnO/SiO$_2$ islands 150 may vary depending on the desired characteristics of the SAWs generated by the IDTs 120.

While the process 200 is described above with reference to a p-type GaAs substrate 190, the same process may be used to generate and enhance SAWs on other III-V semiconductor materials that have good photoelectric properties but weak piezoelectricity, such as gallium antimonide (GaSb), indium arsenide (InAs), and indium gallium arsenide (InGaAs). The process 200 provides the foundation for using SAWs to improve a variety of III-V semiconductor-based optoelectronic devices 100, such as photocathodes, photomultipliers, photodetectors, etc.

Additionally, while the process 200 is described above with reference to a ZnO layer 140, the same process may be used to deposit another piezoelectric material—such as lithium niobite (LiNbO3) and aluminum nitrate (AlN), etc.—to form a piezoelectric coupling layer with a strong piezoelectric coupling effect that increases the intensity of surface acoustic waves on the III-V semiconductor surface.

Finally, while the process 200 is described above with reference to a SiO$_2$ buffer layer 160, the same process may be used to deposit another material that masks the crystalline surface of the III-V semiconductor substrate and increases the quality of the piezoelectric coupling layer.

Figure 3C:
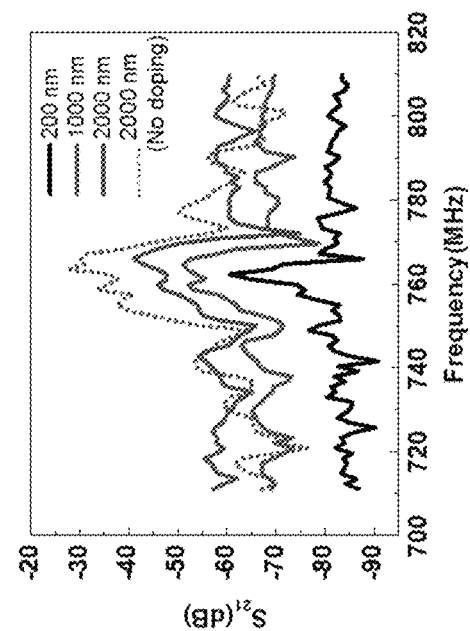
FIG. 3C is a graph comparing the transmission coefficient $S_{21}$ of SAWs generated by IDTs deposited on exemplary devices with ZnO layers of different thicknesses.
Figure 3A:
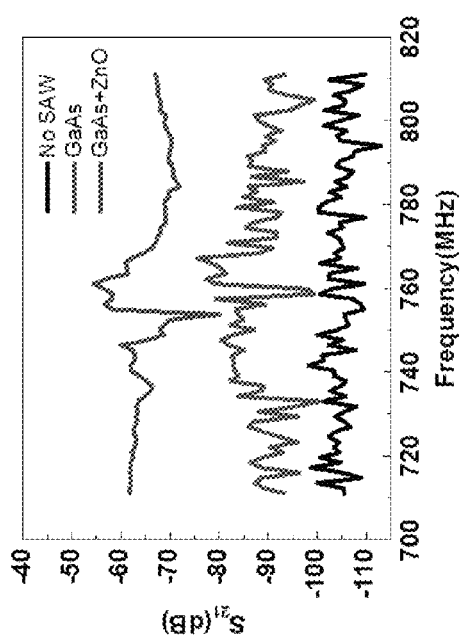
FIG. 3A is a graph comparing the transmission coefficient $S_{21}$ of SAWs generated by IDTs deposited on exemplary devices with and without an added ZnO layer.

FIG. 3A is a graph comparing the transmission coefficient (S-parameter $S_{21}$) of SAWs generated by IDTs 120 deposited on the p-type GaAs substrate 190 with and without the added ZnO layer 140.

Figure 3B:
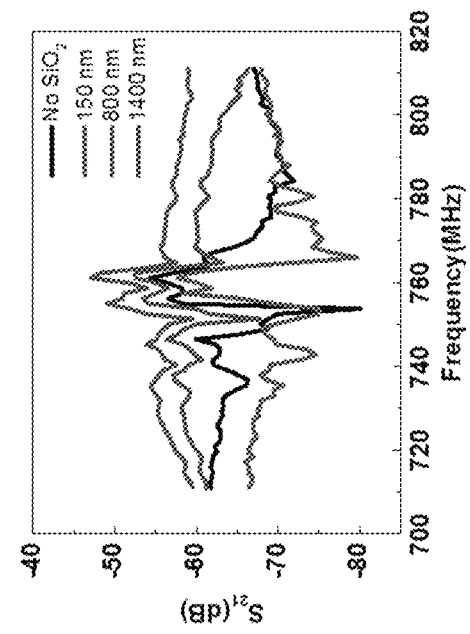
FIG. 3B is a graph comparing the transmission coefficient $S_{21}$ of SAWs generated by IDTs deposited on exemplary devices with $SiO_2$ buffer layers of different thicknesses.

FIG. 3B is a graph comparing the transmission coefficient $S_{21}$ of SAWs generated by IDTs 120 on samples with SiO$_2$ buffer layers 160 of different thicknesses. As shown in FIG. 3B, compared to the sample without a SiO$_2$ buffer layer 160 (black line), a thin (150 nm, red line) SiO$_2$ buffer layer 160 results in higher insertion loss, which is a sign of reduced performance of SAWs. The peak value of the transmission coefficient $S_{21}$ at center frequency of SAW decreases from −54 dB to −57 dB, as well as the values in the rest frequency range. Increasing the thickness of the SiO$_2$ buffer layer 160 to 800 nm increases the peak value at center frequency of SAW to −52 dB, which is a little bit higher than the one without the SiO$_2$ buffer layer 160 (black line). After continuing increasing the thickness of the SiO$_2$ buffer layer 160 to 1400 nm (green line), the values of transmission coefficient $S_{21}$ in whole frequency range appear clearly higher than the one without the SiO$_2$ buffer layer 160. Both the peak transmission coefficient $S_{21}$ value at center frequency (−47 dB) and the bandwidth are improved with a SiO$_2$ buffer layer 160 of 1400 nm, which proves the enhancement of SAW transmission performance.

FIG. 3C is a graph comparing the transmission coefficient $S_{21}$ of SAWs generated by IDTs 120 depending on the thickness of the ZnO layer 140. Additionally, the dotted curve of FIG. 3C shows the transmission performance on an undoped GaAs substrate 190. As shown in FIG. 3C, the enhancement of SAW to the p-type GaAs substrate 190 increases as the thickness of the ZnO layer 140 increases from 200 nm to 1000 nm to 2000 nm.

All of the test results shown in FIGS. 3A-3C are from experiments conducted on single-finger IDTs 120 with a finger width of 0.9 micrometers (μm). The SAW delay line between the input IDT 110 and the output IDT 130 has the same distance (800 μm) and [011] direction.

Figure 4B:
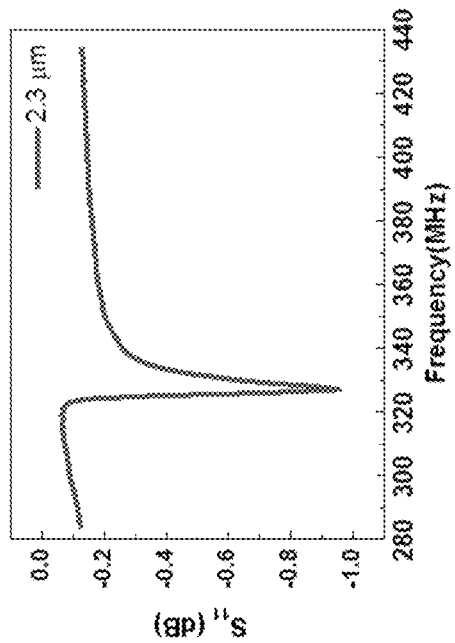
FIG. 4B is a graph of the reflection coefficient $S_{11}$ generated IDTs with a finger width of 0.9 μm deposited on an exemplary device.
Figure 4D:
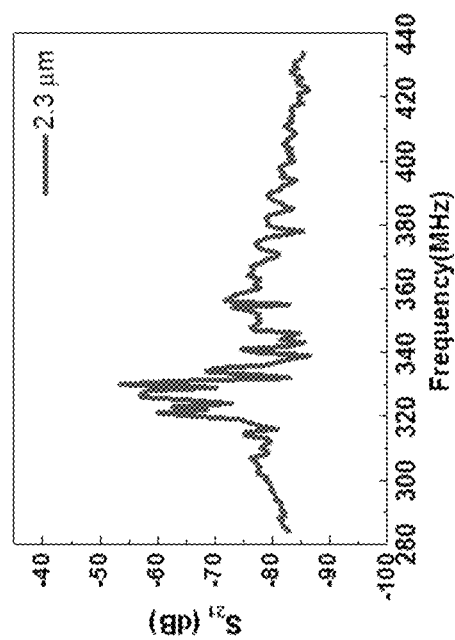
FIG. 4D is a graph of the reflection coefficient $S_{11}$ generated IDTs with a finger width of 2.3 μm deposited on an exemplary device.
Figure 4A:
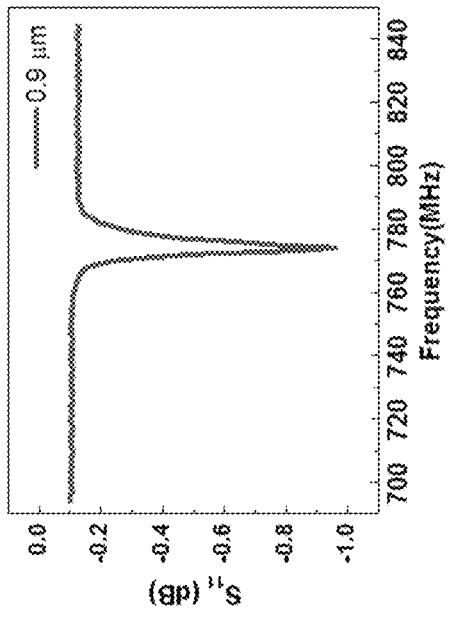
FIG. 4A is a graph of the transmission coefficient $S_{21}$ generated by IDTs with a finger width of 0.9 μm deposited on an exemplary device.
Figure 4C:
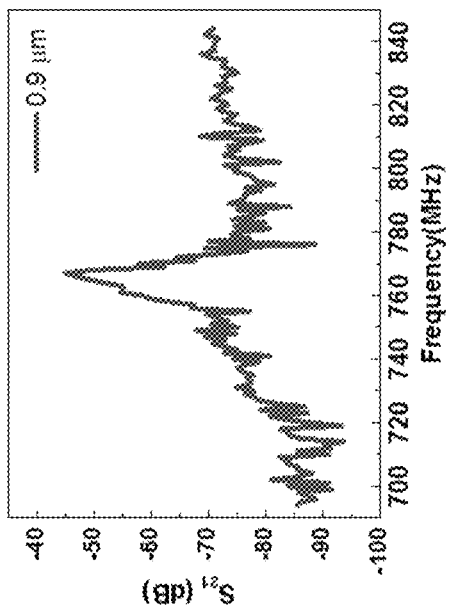
FIG. 4C is a graph of the transmission coefficient $S_{21}$ generated by IDTs with a finger width of 2.3 μm deposited on an exemplary device.

FIG. 4A is a graph of the transmission coefficient $S_{21}$ generated by IDTs 120 with finger widths of 0.9 μm. FIG. 4B is a graph of the reflection coefficient (S-parameter $S_{11}$) generated through the 0.9 μm-width IDT 120. In both instances, the x-axis refers to radio frequency range and the y-axis refers to the transmission loss $S_{21}$ and reflection loss $S_{11}$ in unit of dB. Similarly, FIG. 4C is a graph of the transmission coefficient $S_{21}$ and FIG. 4D is a graph of the reflection coefficient $S_{11}$ of the SAW generated by IDTs 120 with finger widths of 2.3 μm. As shown in FIGS. 4A through 4D, the SAWs are successfully generated and transmitted along the highly doped p-type GaAs surface 190 in both cases.

As discussed above, the center frequency of a SAW is determined by the dimensions of the IDTs 120 and the SAW velocity in the specific material (in this instance, the GaAs substrate 190). As shown in FIGS. 4A and 4B, for the device 100 with IDTs 120 having a finger width of 0.9 μm, the center frequency of SAW is 767 megahertz (MHz) with an insertion loss $S_{21}$ of −44.9 dB and reflection loss $S_{11}$ of −0.96 dB. As shown in FIGS. 4C and 4D, for the device 100 with IDTs 120 having a finger width of 2.3 μm, the center frequency of SAW changed to 326 MHz, the peak transmission value of $S_{21}$ decreased to −57.1 dB, and the reflection coefficient $S_{11}$ changed to −0.95 dB.

This center frequency shift with the change of finger widths of the IDTs 120 (from 0.9 μm to 2.3 μm) is consistent with the theory that smaller finger widths of IDTs 120 leads to a proportionally higher center frequency of SAW resonance in a specific piezoelectric material (the GaAs substrate 190). The results show the capability of the device 100 in propagating SAWs with different frequencies on the highly doped p-type GaAs substrate 190. In addition, by comparing the two cases, we can see that a SAW with a higher frequency has a better transmission performance on the p-type GaAs surface 190 with the help of the ZnO/SiO$_2$ islands 150.

As mentioned above, the application of dynamic strain and electric fields of surface acoustic waves has been used as a successful tool for industrial applications such as filters, resonators and sensors. As a result, many electronic systems currently available incorporate SAW-based signal processing devices. SAWs also have many advantages in other research fields, such as being able to manipulate optically generated electronic excitations in semiconductors and to improve the quantum efficiency (QE) of optoelectronic devices. However, in most cases, SAWs can only be generated and propagated along piezoelectric materials. This greatly limits the utilization of SAWs for optoelectronic and acoustoelectric hybrid applications because most commonly used piezoelectric materials—including ZnO (3.1 eV-3.4 eV), AlN (6.0 eV-6.2 eV) and LiNbO$_3$ (3.5 eV-4.7 eV)—have wide band-gap that limits their applications in photoelectric devices.

Two-dimensional (2D) materials, sometimes referred to as single-layer materials, are crystalline materials consisting of a single layer of atoms. The nanostructures of 2D materials have been studied and used for the transistor-based photodetection, due to their unique optoelectronic properties.

Figure 5:
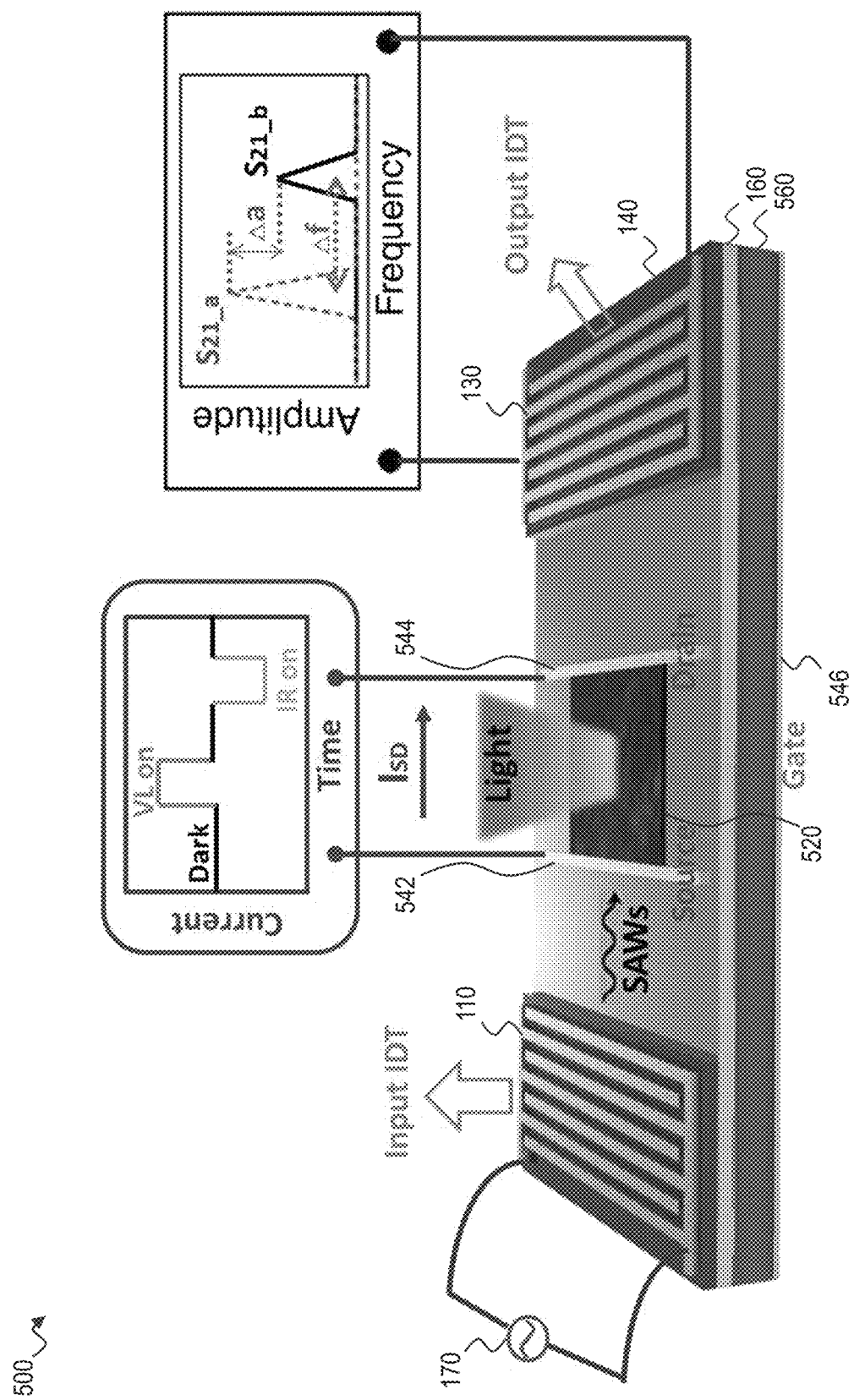
FIG. 5 is a diagram of a SAW-enhanced two-dimensional material photodetector according to an exemplary embodiment.

FIG. 5 is a diagram of a SAW-enhanced two-dimensional material photodetector 500 according to an exemplary embodiment. As shown in FIG. 5, the photodetector 500 includes a 2D material 520, a SiO$_2$ buffer layer 160, and a gallium antimonide (GaSb) layer 560. An input IDT 110 and an output IDT 130 are each patterned on ZnO islands 140. The input IDT 110 is driven by an alternating current source 170. The photodetector 500 includes a metal source electrode 540 and a metal drain electrode 544 on top of the SiO$_2$ buffer layer 160 between the ZnO islands 140 and a metal gate electrode 546 on the bottom of the GaSb layer 560.

A bias voltage is applied between the source electrode 542, the drain electrode 544, and the gate electrode 546. The photodetector 500 is then able to detect light applied onto the 2D material film 520, whether the light is visible or IR. The current $I_{SD}$ flowing between the source electrode 542 and the drain electrode 544 increases when the photodetector 500 detects visible light and decreases when the photodetector 500 detects IR light as shown in the current v. time graph of FIG. 5.

The key factor to extend the photodetection spectrum of the photodetector 500 to IR range is the substrate material that has a small band gap to absorb photons in IR range, and then to modulate the band diagram of 2D material. Therefore, in addition the GaSb substrate 560 shown in FIG. 5, other III-V semiconductor materials may be used, such as indium arsenide (InAs) and indium gallium arsenide (InGaAs).

In addition to the transistor-based photodetection (measuring source-drain current) described above, the transmission characteristics ($S_{21}$, $S_{11}$) of the SAW may also independent provide good sensing information. SAW sensors have been widely used for photodetection because of their advantages such as small size, low cost, fast response, and high sensitivity. When the 2D material film 520 and the surface of the GaSb (or InAs or InGaAs) substrate 560 is illuminated by the incident light, the photo-excited carriers inside the surface materials will interact with the piezoelectric field induced by the propagating SAW, which will result in change of the SAW amplitude, phase and velocity. Therefore, by using the output IDT 130 to receive and measure the SAW signal on the other side of the photodetector 500, the SAW-based photodetection (measuring SAW transmission characteristics) may be simultaneously achieved and utilized to provide additional sensing information. As shown in the amplitude v. frequency graph in FIG. 5, after the incident light is absorbed on the photodetector 500, the frequency and amplitude of the transmission coefficient $S_{21}$ of the propagating SAW will shift and change. Accordingly, the incident light may be detected by detecting the shifts and changes to the transmission coefficient $S_{21}$.

The photodetector 500, which developed using the technique of propagating strong SAWs on weak piezoelectric materials (such as the highly doped p-type GaAs substrate 190 described above) has a number of advantages. Unlike conventional single layer two-dimensional material photodetectors, the detection range of the two-dimensional material photodetector 500 is extended to IR spectrum. Also, IR photodetection performance, such as the light-to-dark current ratio and the minimum detection limit of the IR intensity, is improved by the SAW for over an order of magnitude. In addition to the transistor-based photodetection (measuring source-drain current), the SAW-based photodetection by the output IDT 130 (measuring SAW transmission characteristics) may be utilized simultaneously to provide additional detection information to further increase the sensitivity and selectivity of the photodetection device 500. This unique advantage makes it possible to build a multi-sensory IR photodetector 500 on one single surface.

The foregoing description and drawings should be considered as illustrative only of the principles of the disclosure, which may be configured in a variety of shapes and sizes and is not intended to be limited by the embodiment herein described. Numerous applications of the disclosure will readily occur to those skilled in the art. Therefore, it is not desired to limit the disclosure to the specific examples disclosed or the exact construction and operation shown and described. Rather, all suitable modifications and equivalents may be resorted to, falling within the scope of the disclosure.

What is claimed is:

1. A device, comprising:
   a doped p-type III-V semiconductor substrate;
   two silicon dioxide ($SiO_2$) and zinc oxide (ZnO) islands, each of the $SiO_2$/ZnO islands comprising a $SiO_2$ buffer layer deposited on the doped p-type III-V semiconductor substrate and a ZnO layer deposited on the $SiO_2$ buffer layer;
   two interdigital transducers (IDTs) each patterned on one of the $SiO_2$/ZnO islands; and
   an exposed surface of the doped p-type III-V semiconductor substrate between the two $SiO_2$/ZnO islands.

2. The device of claim 1, wherein:
   the IDTs include an input IDT that generates surface acoustic waves and an output IDT that receives the surface acoustic waves.

3. The device of claim 2, wherein the input IDT generates surface acoustic waves along the exposed surface of the doped p-type III-V semiconductor substrate.

4. The device of claim 3, wherein:
   the doped p-type III-V semiconductor substrate has a (100) surface and a [011] direction; and
   the input IDT generates surface acoustic waves along the [011] direction of the doped p-type III-V semiconductor substrate.

5. The device of claim 1, wherein the $SiO_2$ buffer layer of each $SiO_2$/ZnO island has a thickness of at least 800 nanometers.

6. The device of claim 1, wherein the doped p-type III-V semiconductor substrate is gallium arsenide.

7. The device of claim 1, wherein the doped p-type III-V semiconductor substrate is gallium antimonide, indium arsenide, or indium gallium arsenide.

8. A method of making a device, the method comprising:
   depositing a silicon dioxide ($SiO_2$) buffer layer on a doped p-type III-V semiconductor substrate;
   depositing a zinc oxide (ZnO) layer on the $SiO_2$ buffer layer;
   patterning two interdigital transducers (IDTs) on the ZnO layer; and
   etching a portion of the ZnO layer and the $SiO_2$ buffer layer between the two IDTs to form two ZnO/$SiO_2$ islands, each supporting one of the two IDTs, and an exposed surface of the doped p-type III-V semiconductor substrate between the two IDTs.

9. The method of claim 8, wherein:
   the IDTs include an input IDT that generates surface acoustic waves and an output IDT that receives the surface acoustic waves.

10. The method of claim 9, wherein the input IDT is patterned such that it generates surface acoustic waves along the exposed surface of the doped p-type III-V semiconductor substrate.

11. The method of claim 10, wherein:
    the doped p-type III-V semiconductor substrate has a (100) surface and a [011] direction; and
    the input IDT is patterned such that it generates surface acoustic waves along the [011] direction of the doped p-type III-V semiconductor substrate.

12. The method of claim 8, wherein the $SiO_2$ buffer layer is deposited such that it has a thickness of at least 800 nanometers.

13. The method of claim 8, wherein the doped p-type III-V semiconductor substrate is gallium arsenide.

14. The method of claim 8, wherein the doped p-type III-V semiconductor substrate is gallium antimonide, indium arsenide, or indium gallium arsenide.

15. A photodetector, comprising:
    a III-V semiconductor substrate;
    a silicon dioxide ($SiO_2$) buffer layer deposited on the doped p-type III-V semiconductor substrate;
    a two-dimensional (2D) material comprising a single layer of atoms on the III-V semiconductor substrate;
    two zinc oxide (ZnO) islands deposited on the $SiO_2$ buffer layer on either side of the 2D material;
    two interdigital transducers (IDTs) patterned on each of the two ZnO islands, the two IDTs including an input IDT that generates surface acoustic waves and an output IDT that receives the surface acoustic waves,
    a source electrode;
    a drain electrode; and
    a gate electrode.

16. The photodetector of claim 15, wherein the input IDT generates surface acoustic waves along the surface of the 2D material.

17. The photodetector of claim 15, wherein a current between the source electrode and the drain electrode varies in response to visible or infrared light that is incident to the 2D material.

18. The photodetector of claim 15, wherein transmission characteristics of the surface acoustic waves vary in response to visible or infrared light that is incident to the 2D material.

19. The photodetector of claim 15, wherein the III-V semiconductor substrate is gallium antimonide.

20. The photodetector of claim 15, wherein the doped p-type III-V semiconductor substrate is gallium arsenide, indium arsenide, or indium gallium arsenide.

21. A device, comprising:
    a doped p-type III-V semiconductor substrate with a crystalline surface;
    a piezoelectric coupling layer that increases the intensity of surface acoustic waves on the doped p-type III-V semiconductor substrate;
    a buffer layer, deposited on the doped p-type III-V semiconductor substrate below the piezoelectric coupling layer, that masks the crystalline surface of the doped p-type III-V semiconductor substrate and increases the piezoelectricity of the piezoelectric coupling layer;
    two interdigital transducers (IDTs), each patterned on piezoelectric coupling layer and the buffer layer, that increases the intensity of surface acoustic waves on the doped p-type III-V semiconductor substrate;

an exposed surface of the doped p-type III-V semiconductor substrate, between the two IDTs.

* * * * *